United States Patent [19]

Gruber

[11] Patent Number: 4,549,407

[45] Date of Patent: Oct. 29, 1985

[54] EVAPORATIVE COOLING

[75] Inventor: Peter A. Gruber, Mohegan Lake, N.Y.

[73] Assignee: International Business Machines Corporation, Armonk, N.Y.

[21] Appl. No.: 597,306

[22] Filed: Apr. 6, 1984

[51] Int. Cl.[4] .............................................. F28D 5/00
[52] U.S. Cl. ...................................... 62/304; 62/314; 62/316; 165/907; 165/911; 357/82
[58] Field of Search ...................... 165/104.33, 104.34, 165/DIG. 14, DIG. 10; 62/304, 314, 315, 316; 357/82

[56] References Cited

U.S. PATENT DOCUMENTS

| | | |
|---|---|---|
| 1,084,562 | 1/1914 | Roth . |
| 1,296,916 | 3/1919 | Burroughs . |
| 2,901,893 | 9/1959 | Saltzman ............................... 62/316 |
| 2,906,103 | 9/1959 | Saltzman ............................... 62/314 |
| 2,941,759 | 6/1960 | Rice et al. ............................. 62/316 |
| 2,990,696 | 7/1961 | Fisher ................................... 62/314 |
| 3,066,499 | 12/1962 | Fisher et al. .......................... 62/316 |
| 3,361,195 | 1/1968 | Meyerhoff et al. .................... 165/80 |
| 3,706,010 | 12/1972 | Laermer et al. ..................... 317/100 |
| 3,725,566 | 4/1973 | Plizak .................................. 62/314 |
| 3,771,027 | 11/1973 | Marek ............................... 317/235 R |
| 4,126,879 | 11/1978 | Kessler, Jr. et al. ................... 357/82 |
| 4,188,996 | 2/1980 | Pellant et al. .......................... 165/80 |
| 4,322,737 | 3/1982 | Sliwa, Jr. ............................... 357/82 |
| 4,323,914 | 4/1982 | Berndlmaier et al. ................. 357/82 |

FOREIGN PATENT DOCUMENTS 474122  1/1976  U.S.S.R. ..................... 165/DIG. 14

OTHER PUBLICATIONS

Chapter 12-3, pp. 509-513 of a book on Heat Transfer by J. P. Holman, published by McGraw Hill, 5th Edition.

"High-Performance Heat Sinking for VLSI" by Tuckerman and Pease, IEEE Electron Device Letters, vol. EDL-2, No. 5, May 1981.

Primary Examiner—Albert W. Davis, Jr.
Attorney, Agent, or Firm—Alvin J. Riddles

[57] ABSTRACT

Evaporative cooling particularly useful for semiconductor integrated circuits is more efficient when a liquid is completely evaporated at the heat radiating surface. The liquid is converted to droplets and mixed with the gas at the heat radiating surface.

7 Claims, 1 Drawing Figure

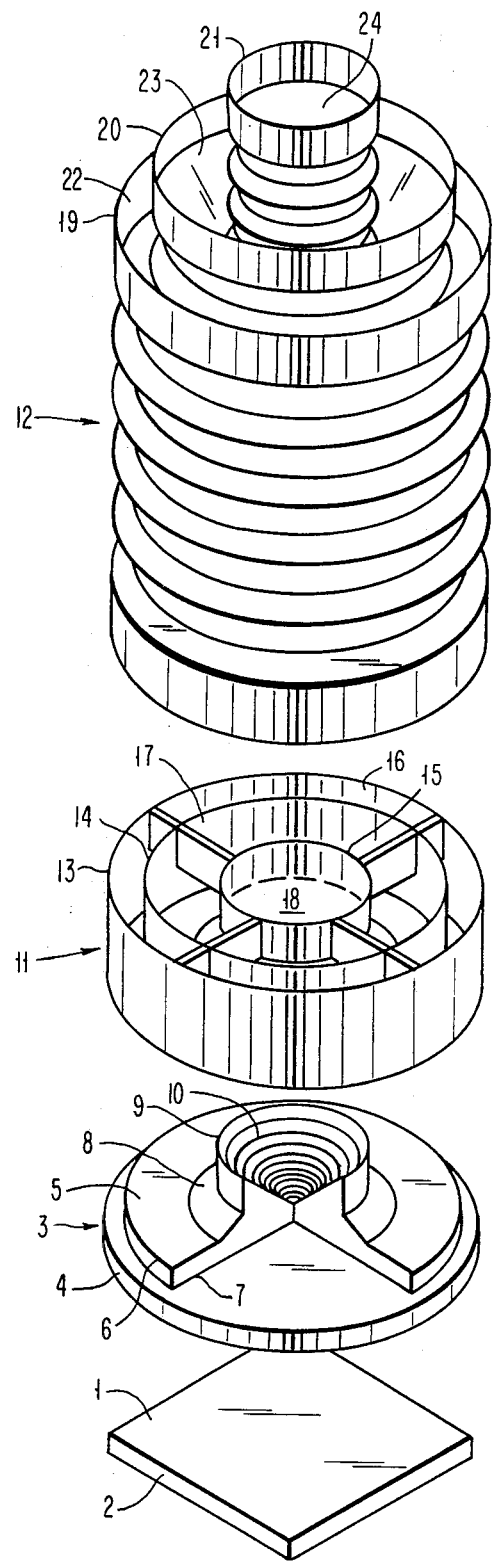

EVAPORATIVE COOLING

Description

TECHNICAL FIELD

The technical field of the invention is in the transfer of heat using the latent heat of evaporation of a liquid.

In densely packed apparatus even small quantities of heat per individual item can in combination become more than the specifications will permit yet the close packing frequently limits the flow rate of conventional cooling techniques. A particularly difficult cooling problem is being encountered in the semiconductor integrated circuit field where as the density of devices increases, large amounts of total power is produced from the thousands of devices, the semiconductor will not tolerate large temperature variations and the size involved limits coolant flow rates.

BACKGROUND ART

Efforts to improve flow and heat transfer rate in small sizes has been shown in IEEE EDL-2, pages 126–129, wherein microgrooves and microwhiskers are placed on the back of integrated circuit chips. The use of the latent heat of evaporation of a liquid has been recognized as an efficient cooling means in U.S. Pat. No. 4,322,737 wherein a fluid is evaporated in microgrooves and in the technique of transpirational cooling described in Chapter 12-3, pages 509–513 of a book on Heat Transfer by J. P. Holman, published by McGraw Hill, wherein a fluid is forced through a sintered plate into the boundary layer of a gas stream.

BRIEF DESCRIPTION OF THE DRAWING

The FIGURE is an exploded view of the functional parts involved in cooling by delivering a liquid to a heat radiating surface in a form that completely evaporates and is replenished.

DISCLOSURE OF THE INVENTION

The invention is cooling by complete evaporation of a liquid in contact with a heat radiating surface. It has been found that evaporation is more efficient where the liquid to be evaporated completely evaporates and is constantly replenished in contrast to a less efficient situation where the liquid to be evaporated is on the surface in a quantity that forms a coating and only the surface of the coating that is exposed evaporates. Complete liquid evaporation that is replenished is readily achieved by continuously providing the liquid in a mist of small droplets. The droplets may be as small as the minimum surface tension shaped quantity at one extreme and at the other for good efficiency they should not be so large as to form a coating with liquid on the item from which heat is being transferred.

In order to facilitate explanation, the invention will be described in terms of the materials air and water although it will be apparent to one skilled in the art that other gas and liquid combinations may be employed having physical properties that may assist in accommodating particular specification constraints such as corrosiveness of materials, temperature range and flow rates as examples. Initial chemical purity to avoid residues on evaporation is essential.

In accordance with the invention, water is delivered to a heat radiating surface for complete evaporation and replenishing by providing the water in fine droplet form, and mixing it with air at the location where transfer of heat is desired. The air and the water droplets are separately supplied to the location of heat transfer. The droplets are completely evaporated in the air at the location of heat transfer and the resulting moisture laden air is then exhausted. The conditions at the heat radiating surface are maintained so that the water droplets do not coat either the surface from which heat is being transferred or the walls of the supply conduits. It has been found that droplet evaporative cooling is more efficient if a coating of liquid is not permitted to form. In meeting this criterion of the invention it is thus preferable in general to separate the air or gas and the liquid droplet supplies thereby permitting them to come together only at the location where the heat is to be transferred. It is also preferable in general to have the formation of the droplets fairly proximate to the location where the heat is to be transferred since the droplets on collision tend to coalesce and form quantities large enough to coat with liquid.

For further purposes of facilitating explanation the invention will be described in connection with a particular illustration of cooling a semiconductor integrated circuit although it will be apparent to one skilled in the art that the principles involved can readily be adapted to achieve an efficiency gain for most cooling situations.

The FIGURE is an exploded view of the functional parts of a droplet evaporative cooling assembly for a semiconductor integrated circuit.

Referring to the FIGURE, the heat radiating location is surface 1 of a semiconductor chip 2. A heat exchanger member 3 is made up of a solid member 4 that contacts the surface 1 and conducts heat to a liquid droplet formation and distributing means which is a sintered member 5. It has been found that sintered materials provide the combined functions of droplet formation and when positioned between conduits with differential pressures flow direction is achieved. The size of the particles in the sintered member 5 is related to droplet size and the shape of the sintered material permits air flow direction to be readily arranged.

The sintered member 5 having an outside surface 6 also has another surface 7 thereof in thermal transfer with the solid member 4 such as being bonded thereto. The member 3 is provided with several features that permit it to receive water at the periphery, relatively dry air at the region inside of the periphery and to have the moisture laden higher temperature product of the evaporative heat transfer conducted out of the center. The features are an air deflection member 8 which directs the air in a horizontal direction and an exhaust member 9 having a tapered configuration 10 that operates to relatively equalize the flow in the sintered member over the surface 7 where elements 4 and 5 are joined.

In operation the water enters the sintered material member 5 where it is converted to droplets which completely evaporate in the interstices between the sintered particles in the presence of the air and the supply pressure or exhaust lower pressure results in the heat and moisture laden exhaust product being conveyed out through the center.

The delivery of the water, air and exhaust products is arranged through a manifold 11 and supply conduit member 12.

The manifold 11 has an outside portion 13, a central position 14 and an inner portion 15 which are essentially concentric members and which provide a separate water supply channel 16 on the periphery, an air supply channel 17 in the central region and an exhaust port 18 in the center supported by ribs that are not numbered. The inside diameters of the members 13 and 15 correspond with a press fit to the outside diameters of elements 6 and 9, respectively.

The supply conduit member 12 involves three essentially concentric members 19, 20, and 21 which again provide an outside water supply channel 22, a central air supply channel 23 and an exhaust port 24. The conduits are shown in bellows configuration for assembly and expansion flexibility.

The assignment of outside, inner and inside for water, air and exhaust is usually governed by air and water mixing considerations, thermal insulation for condensation control and the desire to exhaust the heat and moisture laden air from the heat transfer location with the shortest travel. The use of the outer duct for water, the middle for air and the center for exhaust permits the air to provide thermal insulation to prevent the saturated exhaust vapor from excessively condensing on cold walls such as would occur if the water duct were adjacent.

BEST MODE FOR CARRYING OUT THE INVENTION

The principle of the invention is the delivery to the location of heat transfer of the liquid for complete evaporation and replenishment in droplet form too small to form a coating. The droplets are mixed at the location of heat transfer with a gas and completely evaporate providing the very high efficiency evaporative heat transfer of the invention.

The cooling of an integrated circuit chip requires a number of interrelated considerations many of which are the result of particular specifications.

The following are exemplary specifications for materials, size and cooling efficiency for an integrated circuit chip of about 7 millimeters by 7 millimeters or about 0.5 cm$^2$ having about 30,000 circuits which generate about 3 milliwatts per circuit for a total of the order of 90 watts which with a good safety margin, would be adequately cooled if 300 watts/sec per cm$^2$ could be dissipated.

| Materials, Sizes and Fabrication | |
| --- | --- |
| Heat Exchanger Element 3 | |
| Solid Member 4 | nickel - 1.0 cm - outside diameter - 0.02 cm thick bonded to heat radiating surface 1 of silicon by non-wetting solder such as ostalloy. |
| Sintered Member 5 | nickel - 0.99 cm outside diam. - 0.03 cm thick at face 6, 0.3 cm diam. at element 9 - should be corrosion resistant and contaminant free. Elements 4 and 5 should be joined at 7 by thermal fusing without interface metallurgy. |
| Manifold Element 11 | |
| Element 13 - 0.55 cm × 0.005 cm - nickel | |
| Elements 14, 15 - 0.5 × 0.005 cm - nickel | |
| Elements 13, 14 and 15 are furnace brazed to ribs. | |
| Conduit Element 12 | |
| Elements 19, 20, 21 - nickel - 1.0 cm × .0025 cm Braze or cement to manifold 11 parts. | |

In arranging the materials, the power density on the heat transfer surface 1 determines both the porosity of the sintered member 5 and the water and air flow rates.

It will be apparent to one skilled in the art that there will be a relationship based on the latent heat of vaporization between the water and air as to the quantity of each that is required for complete evaporation. As long as the water to air ratio for a specific power density is not exceeded, all the water will evaporate.

With respect to the porosity of the sintered member 5, the good heat transfer properties of a relatively corrosion resistant metal would be preferred. There is a size tradeoff in that the smaller the pore size, the better the cooling due to increased surface area but smaller pores do result in an increase in system operating pressure. For this example, a porosity range from 25 to 200 microns is satisfactory. In the member 5 the water on the side of the sintered grain facing the flow is compressed and thinned, thus assuring good evaporation. Water on the side of the grain opposite to the flow is in a venturi effect produced by air flow around the sintered grain further enhancing evaporation.

The air and water flow rates would be established as follows.

The air flow rate should be sufficient to produce a saturated vapor at the exhaust conduit 24 at operating pressure and temperature.

Under the assumptions that element 5 has 50% porosity, that the thermal conductance of the combination of elements 4 and 5 would be the sum of the thermal conductance for each element and that the thermal resistance for the combination of elements 4 and 5 would be the sum of the reciprocals of the individual thermal conductance for elements 4 and 5 then K the thermal conductance for element 3 would be as set forth in Equation 1.

$$K = \frac{kA}{L} \quad \text{Equation 1}$$

where
K is the thermal conductance
k is the thermal conductivity of a material
A is the area, and
L is the length or thickness so that K for element 5 would be as set forth in Equation 2.

$$K_{ELEMENT\,5} = \frac{0.449 \times 1\ cm^2}{0.03} = 14.98 \quad \text{Equation 2}$$

where $K_{NICKEL} = 0.899$ @ 50% porosity = 0.449 and K for element 4 would be as set forth in Equation 3.

$$K_{ELEMENT\,4} = \frac{0.899 \times 1\ cm^2}{0.02} = 44.95 \quad \text{Equation 3}$$

and the combined thermal resistance R for each is as set forth in Equation 4.

$$R = \frac{1}{K_{ELEMENT\,4}} + \frac{1}{K_{ELEMENT\,5}} = \quad \text{Equation 4}$$

$$\frac{1}{14.98} + \frac{1}{44.95} = 0.089°\ C./W$$

the increase in temperature ΔT would be the product of the thermal resistance and the power density Q as set forth in Equation 5.

$$\Delta T = RQ = 0.089 \times 300 = 26.7° \text{ C.} \quad \text{Equation 5}$$

With a desired condition that the maximum temperature at the chip surface 1 would be for example 85° then the temperature at element 3 would be the temperature at the heat transfer surface-$\Delta T$ as set forth in Equation 6.

$$T_{ELEMENT\ 3} = T_{ELEMENT\ 1} - \Delta T = 85 - 26.7 = 58.3° \text{ C.} \quad \text{Equation 6}$$

The water flow rate is the power density divided by the latent heat of vaporization of water as set forth in Equation 7.

$$\frac{300 \text{ watts/sec}}{2445 \text{ joules/gm}} = 0.123 \text{ grams/sec or} \quad \text{Equation 7}$$

$$0.0068 \text{ moles/sec which is about 7.4 milliliters per minute}$$

In order to provide the desired flow, the pressure would be as set forth in Equation 8.

$$P_{RATIO} = \frac{P_{WATER}}{P_{AIR}} = \frac{138.5 \text{ mm}}{621.5 \text{ mm}} = 0.22 \quad \text{Equation 8}$$

where $P_{WATER}$ @ 58.3° C.=138.5 mm and the air flow rate would be set forth in Equation 9.

$$N_{AIR} = \frac{N_{WATER}}{P_{RATIO}} \times \text{Universal Gas Constant} = \quad \text{Equation 9}$$

$$\frac{0.0068}{0.22} \times 22.4 = 0.672 \text{ liters/sec} = 40 \text{ liters/minute}$$

What has been described is a principle for high efficiency evaporative cooling wherein a liquid is replenishably delivered for complete evaporation at a heat transfer surface in the form of small droplets. It will be apparent to one skilled in the art in the light of the principles set forth that many substitutions such as grooved plates and porous water conduits are possible for the means of providing the droplets in the air for evaporation at the heat transfer location.

Having thus described my invention, what I claim as new and desire to secure by Letters Patent is:

1. Evaporative cooling apparatus comprising in combination
   a liquid delivery conduit extending from a heat transfer location to a region remote therefrom,
   a gas delivery conduit concentric with said liquid delivery conduit extending from said heat transfer location to a region remote therefrom,
   means for forming droplets of said liquid in the immediate vicinity of said heat transfer location,
   means for mixing said gas and said droplets for evaporation adjacent said heat transfer location, and
   exhaust means concentric with said liquid delivery conduit and said gas delivery conduit for removal of the combination said gas and said evaporated liquid.

2. The apparatus of claim 1 wherein said droplet forming means is in a sintered member.

3. The apparatus of claim 2 wherein said sintered member includes said means for mixing said droplets and said liquid and gas are water and air respectively.

4. Semiconductor integrated circuit chip cooling apparatus comprising in combination
   a liquid delivery conduit extending from the vicinity of an integrated circuit chip to a location remote from said chip,
   a gas delivery conduit concentric with said liquid delivery conduit extending from the vicinity of said integrated circuit chip to a location remote from said chip,
   means forming droplets of said liquid positioned in the immediate vicinity of a heat radiating face of said integrated circuit chip,
   means for mixing said gas and said droplets for evaporation in adjacent thermal contact relationship with said heat radiating face of said integrated circuit chip, and
   means concentric with said liquid delivery conduit and said gas delivery conduit for exhausting the combination of said gas and said evaporated droplets.

5. The apparatus of claim 4 where said liquid, said gas and said exhaust conduits are external, intermediate and central, respectively.

6. The apparatus of claim 5 wherein said conduits are flexible.

7. The apparatus of claim 6 wherein said conduits and said sintered member are of nickel, said liquid is water and said gas is air.

* * * * *